(12) United States Patent
Yang et al.

(10) Patent No.: US 9,001,299 B2
(45) Date of Patent: Apr. 7, 2015

(54) LOW RESISTANCE WIRING STRUCTURE AND LIQUID CRYSTAL DISPLAY DEVICE USING THE SAME

(75) Inventors: Hee-Jung Yang, Gyeonggi-Do (KR); Gyu-Won Han, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 665 days.

(21) Appl. No.: 12/337,496

(22) Filed: Dec. 17, 2008

(65) Prior Publication Data

US 2009/0267087 A1    Oct. 29, 2009

(30) Foreign Application Priority Data

Apr. 28, 2008 (KR) .......................... 10-2008-0039547

(51) Int. Cl.
| | | |
|---|---|---|
| G02F 1/136 | (2006.01) | |
| G02F 1/1343 | (2006.01) | |
| G02F 1/1362 | (2006.01) | |
| H01L 23/532 | (2006.01) | |
| H01L 27/32 | (2006.01) | |
| H01L 27/12 | (2006.01) | |

(52) U.S. Cl.
CPC G02F 1/136286 (2013.01); *G02F 2001/13629* (2013.01); *H01L 23/53238* (2013.01); *H01L 27/3276* (2013.01); *H01L 2924/0002* (2013.01); *H01L 27/124* (2013.01)

(58) Field of Classification Search
USPC .................................... 349/46, 139, 147, 148
See application file for complete search history.

(56) References Cited

U.S. PATENT DOCUMENTS

| | | | | |
|---|---|---|---|---|
| 6,350,995 | B1 * | 2/2002 | Sung et al. ...................... | 257/59 |
| 2004/0183763 | A1 * | 9/2004 | Matsui et al. ................... | 345/87 |
| 2005/0122443 | A1 * | 6/2005 | Kim et al. ....................... | 349/46 |

FOREIGN PATENT DOCUMENTS

KR    1020010029818 A    4/2001

OTHER PUBLICATIONS

Office Action issued in corresponding Korean Patent Application No. 10-2008-0039547, mailed Feb. 6, 2013.

* cited by examiner

*Primary Examiner* — Jessica M Merlin
(74) *Attorney, Agent, or Firm* — Brinks Gilson & Lione

(57) ABSTRACT

A low-resistance wiring structure and a liquid crystal display are disclosed. The liquid crystal display includes a first substrate; a thin film transistor (TFT) formed on the first substrate and formed of a gate wiring, a data wiring and a semiconductor layer; and a second substrate attached to the first substrate in a facing manner, wherein at least one of the gate wiring and the data wiring is formed as a first wiring made of copper, a second wiring made of a barrier metal preventing spreading of copper, and a metal oxide film pattern formed between the first and second wirings. A MO/Cu wiring structure is implemented by using pure molybdenum, so that the low-resistance wiring structure with high reliability can be formed at a low cost.

9 Claims, 7 Drawing Sheets

LOW RESISTANCE WIRING STRUCTURE AND LIQUID CRYSTAL DISPLAY DEVICE USING THE SAME

BACKGROUND

1. Field of the Invention

The present invention relates to a low resistance wiring structure and a liquid crystal display device using the same, and more particularly, to a low resistance wiring structure including copper applied to a semiconductor and a display element and a liquid crystal display device using the same.

2. Description of the Related Art

In general, a liquid crystal display (LCD) is a representative semiconductor-related device employing copper-containing low resistance wirings.

The LCD, a light thin film type flat panel display (FPD) that replaces the existing display device CRT (Cathode Ray Tube), is a device for displaying images by using optical anisotropy of liquid crystal and is actively applied to a notebook computer, a desk top monitor, or the like, because of its good resolution, color display and picture quality.

The LCD includes a color filter substrate, an array substrate, and a liquid crystal layer formed between the color filter substrate and the array substrate.

An active matrix (AM) driving method commonly used for the LCD is a method in which liquid crystal molecules in a pixel part are driven by using amorphous silicon thin film transistors (a-Si TFTs) as switching elements.

Figure 1:
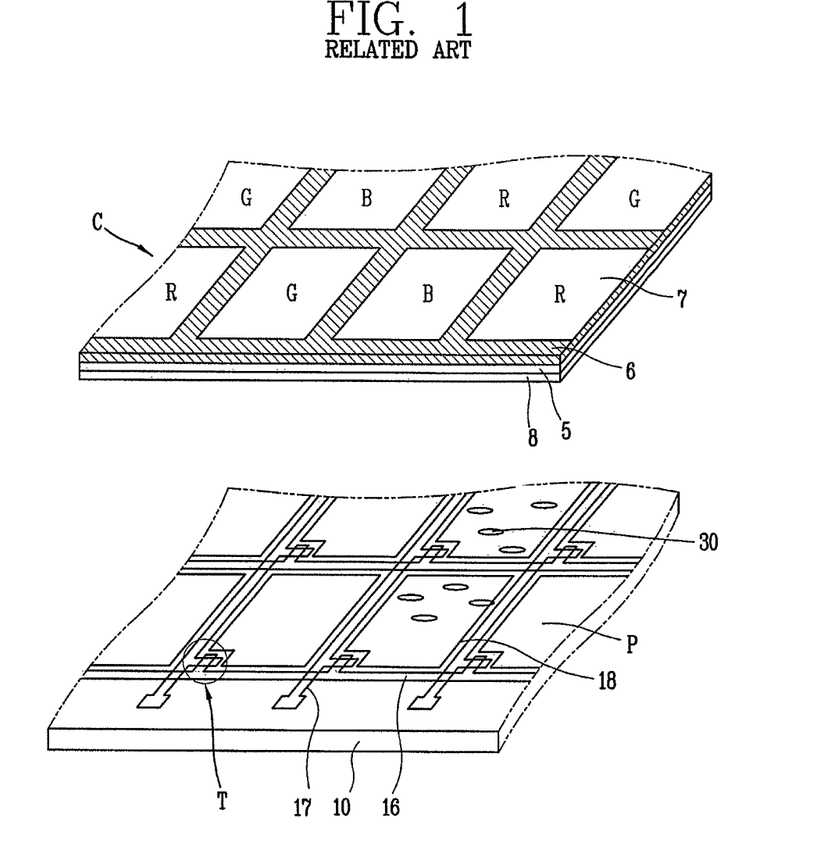
FIG. 1 is an exploded perspective view showing a liquid crystal display according to the related art.

FIG. 1 is an exploded perspective view showing an LCD device according to the related art.

As shown in FIG. 1, the LCD includes a color filter substrate 5, an array substrate 10 and a liquid crystal layer 30 formed between the color filter substrate 5 and the array substrate 10.

The color filter substrate 5 includes a color filter (C) including a plurality of sub-color filters 7 that implement red, green and blue colors, a black matrix 6 for dividing the sub-color filters 7 and blocking light transmission through the liquid crystal layer 30, and a transparent common electrode 8 for applying voltage to the liquid crystal layer 30.

The array substrate 10 includes gate lines 16 and data lines 17 which are arranged vertically and horizontally to define a plurality of pixel areas (P), TFTs (T) which are switching elements formed at respective crossings of the gate lines 16 and the data lines 17, and pixel electrodes 18 formed on the pixel areas (P).

The color filter substrate 5 and the array substrate 10 are attached in a facing manner by a sealant (not shown) formed at an edge of an image display region to form a liquid crystal panel, and the attachment of the color filter substrates 5 and the array substrate 10 is made by an attachment key formed on the color filter substrate 5 or the array substrate 10.

In the LCD, a metal is used as a material for forming the metal wirings such as the gate lines or the data lines serving to intermediate signals, and in this case, as the metal has a low resistivity and high corrosion resistance, the reliability and price competitiveness of the product can be increased. As such metal wiring material, aluminum (Al) or an aluminum alloy is typically used.

However, as the LCD is enlarged in size and its resolution increased to resolutions such as SVGA, XGA, SXGA, VXGA or the like, a scanning time is shortened and a signal processing speed is increased. Thus, in order to cope with such trend, it is required to form metal wirings with a metal material of low resistivity.

Recently, copper is actively proposed as a substitute of the existing metal wiring material because it has better resistivity and electromigration characteristics.

However, copper has a weak bonding force with glass substrates and readily spreads to an insulation layer or to a semiconductor layer even at a relatively low temperature (~200° C.), so it is not proper to applied copper as a single metal wiring material.

In an effort to solve such problem, a copper wiring structure, in which a barrier metal layer is additionally disposed of between the glass substrate and a gate wiring and between the semiconductor layer and a data wiring to thereby improve adhesion (bonding) characteristics and prevent spreading of the copper to the semiconductor layer, has been proposed.

Figure 2:
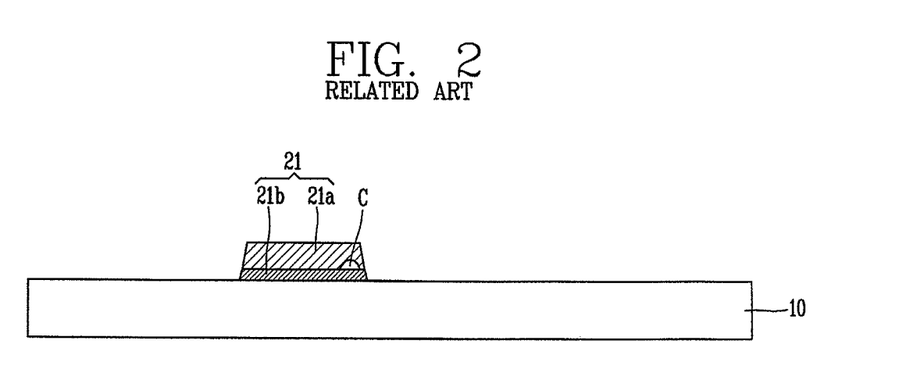
FIG. 2 is a sectional view showing a Mo/Cu wiring according to the related art.

With this method, however, if pure molybdenum is used as the barrier metal layer in fabricating a semiconductor and display element, a galvanic corrosion phenomenon occurs at an interface of Mo and Cu during a wet etching process as shown in FIG. 2. For reference, FIG. 2 shows, for example, a gate electrode 21 disposed on the array substrate 10. A dual-layer copper wiring structure includes a first gate electrode 21a made of copper and a second gate electrode 21b made of pure molybdenum. This structure has a problem in that a galvanic corrosion is generated from the interface of the first and second gate electrodes 21a and 21b, degrading the reliability of the element.

Thus, instead of the pure metal material, a metal alloy such as a molybdenum alloy is used.

However, compared with the pure metal material, the purity of the metal alloy is low because of a target fabrication method and thus the alloy contains much foreign materials. This causes a foreign material defect and an increase in fabrication cost for the target.

BRIEF SUMMARY

A low resistance wiring structure includes a first wiring made of copper; a second wiring positioned below the first wiring and made of a barrier metal preventing spreading of the copper; and a metal oxide film pattern formed between the first and second wirings and preventing electromigration (transfer of electrons) due to a potential difference between the copper and the barrier metal.

An LCD includes: a first substrate; a thin film transistor (TFT) formed on the first substrate and formed of a gate wiring, a data wiring and a semiconductor layer; and a second substrate attached to the first substrate in a facing manner, wherein at least one of the gate wiring and the data wiring is formed as a first wiring made of copper, a second wiring made of a barrier metal preventing spreading of copper, and a metal oxide film pattern formed between the first and second wirings.

A method for fabricating an LCD includes forming a first conductive film made of a barrier metal, a metal oxide film made of an oxide of the barrier metal, and a second conductive film made of copper on a first substrate; selectively patterning the first conductive film, the metal oxide film and the second conductive film to form at least one of a gate wiring and a data wiring on the substrate, the wiring including a first wiring formed of the second conductive film, the second wiring formed of the first conductive film, and a metal oxide film pattern formed of the metal oxide film; forming a TFT including the gate wiring, the data wiring, and a semiconductor layer on the first substrate; and attaching the first substrate and a second substrate in a facing manner.

The foregoing and other features of the present invention will become more apparent from the following detailed

DETAILED DESCRIPTION OF THE DRAWINGS AND THE PRESENTLY PREFERRED EMBODIMENTS

A low-resistance wiring structure and a liquid crystal display (LCD) using the same according to the present invention will now be described in detail with reference to the accompanying drawings.

Figure 3:
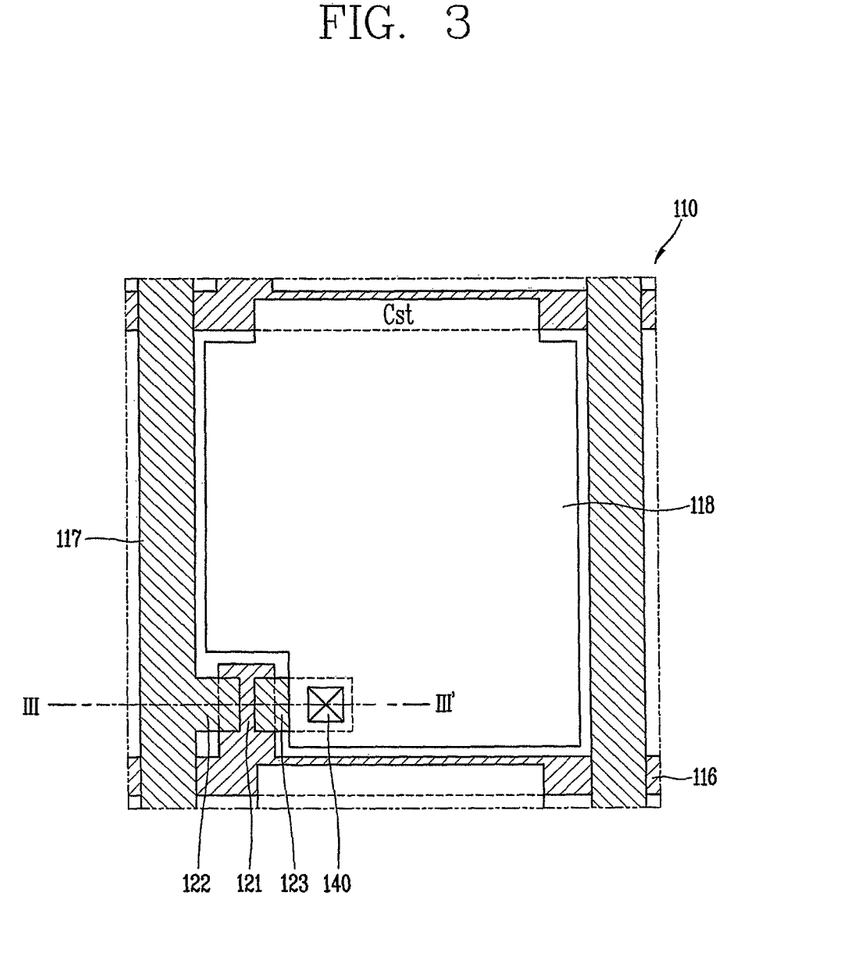
FIG. 3 is a plan view showing a portion of an array substrate of an LCD according to a first embodiment of the present invention.

FIG. 3 is a plan view showing a portion of an array substrate of an LCD according to a first embodiment of the present invention. Specifically, FIG. 3 shows an example of an array substrate of the LCD employing a low-resistance wiring structure according to the first embodiment of the present invention The low-resistance wiring structure according to the present invention may also be applicable to wirings of semiconductor and other display devices, without being limited to the LCD.

In practice, there are N number of gate lines and M number of data lines disposed to cross each other to define M×N number of pixels in an actual LCD. However, in order to simplify the explanation, only a single pixel is shown on the drawing.

As illustrated, gate lines 116 and the data lines 117 are disposed to be arranged vertically and horizontally to define the pixel area on an array substrate 110. A thin film transistor (TFT) which is a switching element is disposed at a crossing of the gate line 116 and the data line 117. A pixel electrode 118 is disposed within the pixel area and is connected with the TFT to drive liquid crystals (not shown) together with a common electrode of a color filter substrate (not shown).

Although not shown, a gate pad electrode and a data pad electrode are formed at edge portions of the array substrate 110, electrically connected with the gate line 116 and the data line 117, respectively, and the gate line and data line respectively transfer a scan signal and a data signal applied from an external driving circuit unit (not shown) to the gate line 116 and the data line 117.

Namely, the gate line 116 and the data line 117 extend to the driving circuit unit so as to be connected with the corresponding gate pad line and the data pad line, and the gate pad line and the data pad line receive the respective scan signal and the data signal from the driving circuit unit via the gate pad electrode and the data pad electrode electrically connected with the gate pad line and the data pad line.

The TFT includes a gate electrode 121 connected with the gate line 116, a source electrode 122 connected with the data line 117, and a drain electrode 123 connected with the pixel electrode 118 via a contact hole 140. The TFT also includes an active pattern (not shown) for forming a conductive channel between the source and drain electrodes 122 and 123 by a gate voltage supplied to the gate electrode 121.

A portion of the previous gate line 116 overlaps with a portion of the upper pixel electrode 118 with a first gate insulating layer (not shown) interposed therebetween to form a storage capacitor Cst. The storage capacitor Cst serves to uniformly maintain voltage which has been applied to a liquid crystal capacitor until a next signal is received. Namely, the pixel electrode 118 of the array substrate 110 forms the liquid crystal capacitor together with the common electrode of the color filter substrate. In general, the voltage applied to the liquid crystal capacitor is not maintained until the next signal is received but rather leaked to disappear. Thus, in order to maintain the applied voltage, the storage capacitor Cst should be connected to the liquid crystal capacitor.

Besides maintaining the signal, the storage capacitor may also have the effect of stabilizing a gray scale representation and reducing flickering and residual images, and the like.

As for the array substrate according to the first embodiment of the present invention constructed as described above, in forming the source/drain electrodes and the gate wirings such as the gate electrode, the gate line and the gate pad line and the data wirings such as the data line and the data pad line, a metal oxide film for blocking electromigration is formed between the copper and the barrier metal layer of a copper wiring structure including copper and an barrier metal layer to form a galvanic corrosion-proof low-resistance wiring structure. This will now be described in detail through the fabrication method of the LCD as follows.

FIGS. 4A to 4E are sectional views sequentially showing a fabrication process taken along line III-III' of the array substrate in FIG. 3, in which the copper wiring structure according to the present invention is applied to the gate wiring of the array substrate.

Figure 4A:
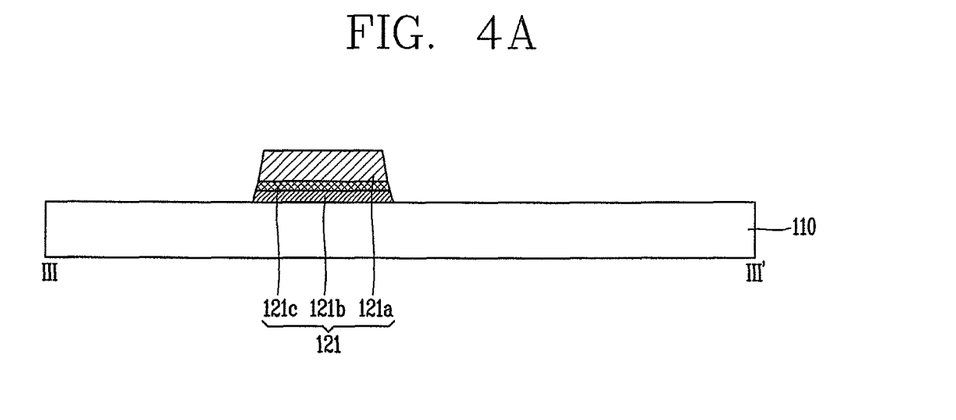
FIGS. 4A to 4E are sectional views sequentially showing a fabrication process taken along line III-III' of the array substrate in FIG. 3.

With reference to FIG. 4A, a gate electrode 121 and a gate line (not shown), each comprised of a triple layer including a barrier metal, a metal oxide film and copper, are formed on the array substrate 110 made of a transparent insulation material such as glass.

In this case, in the first embodiment of the present invention, the gate electrode 121 and the gate line are formed by sequentially depositing a first conductive film, a metal oxide layer and a second conductive film on the entire surface of the array substrate 110 and selectively patterning them through a photolithography process (a first masking process).

Here, the first conductive film may contain a metal such as molybdenum (Mo), tungsten (W), manganese (Mn), technetium (Tc), rhenium (Re), ferrum (Fe), ruthenium (Ru), osmium (Os), or the like, or their nitride. The second conductive film may include copper (Cu) which has good resistivity and electron transfer characteristics. The first conductive film prevents copper, which is the second conductive film, from spreading to an insulating layer or a semiconductor layer, and serves as a barrier metal for improving bonding (adhesion) characteristics with the glass substrate.

The metal oxide film is positioned between the first and second conductive films and restrains electromigration due to a potential difference between copper and the barrier metal to thereby prevent galvanic corrosion. The first masking process according to the first embodiment of the present invention will now be described in detail with reference to the accompanying drawings.

FIGS. 5A to 5D are sectional views showing a first masking process in FIG. 4A.

Figure 5A:
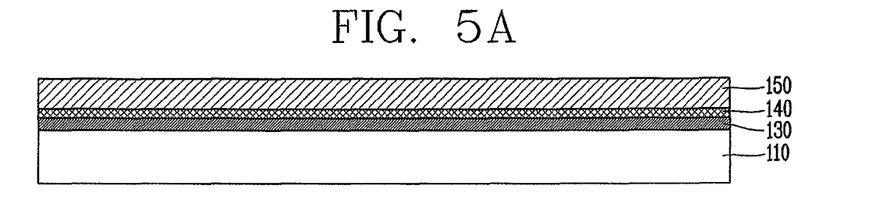
FIGS. 5A to 5D are sectional views showing a first masking process in FIG. 4A.

As shown in FIG. 5A, a first conductive film 130, a metal oxide film 140 and a second conductive film 150 are sequentially formed on the array substrate 110 made of transparent insulation materials such as glass.

The first conductive film 130 may contain metal such as molybdenum (Mo), tungsten (W), manganese (Mn), technetium (Tc), rhenium (Re), ferrum (Fe), ruthenium (Ru), osmium (Os), or the like, or their nitride. The second conductive film may include copper (Cu), which has good resistivity and electron transfer characteristics.

The metal oxide film 140 may include a metal oxide constituting the first conductive film 130. For example, if the first conductive film 130 is made of molybdenum, the metal oxide film 140 may be formed of a molybdenum oxide (MoOx).

In particular, the metal oxide film 140 restrains a galvanic corrosion generated due to a potential difference with copper when a pure metal material instead of a metal alloy is used as a barrier metal layer, and may be formed by using a sputtering method for forming the first conductive film 130 and the second conductive film 150. When exposed to a corrosion environment, the metal oxide film 140 disposed between the first and second conductive films 130 and 150 restrains electromigration due to a potential difference between copper and the barrier metal, thereby preventing a galvanic corrosion.

Here, the first conductive film 130 and the metal oxide film 140 may be formed with a thickness of about 10 Å~500 Å, and in case of the second conductive film 150, it may have a different thickness according to types of wirings to be formed, and for example, if the gate electrode is formed, the second conductive film 150 may be formed with a thickness of about 1000 Å~5000 Å.

The metal oxide film 140 may be deposited through sputtering at a flow ratio of 0.01%~50% of $Ar/O_2$ and at a pressure of 0.01 Pa-50 Pa, or may be deposited in a state were only $O_2$ gas is injected, without Ar gas.

Figure 5B:
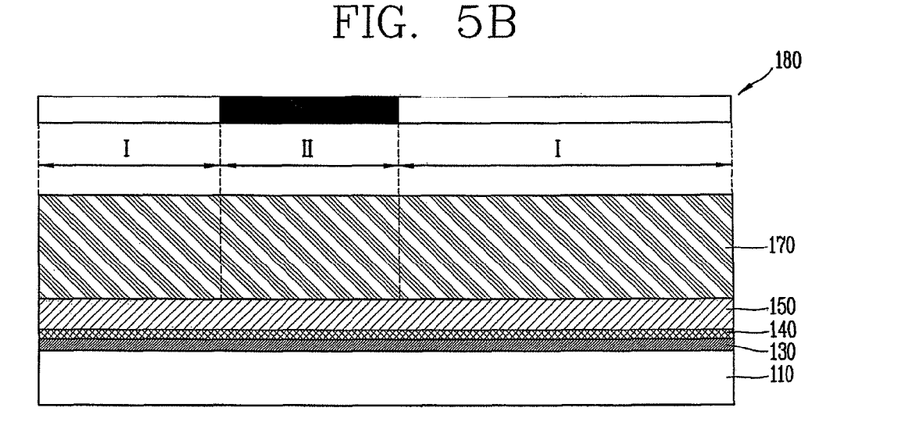

Next, as shown in FIG. 5B, a photosensitive film 170 made of a photosensitive material such as photoresist is formed on the array substrate 110 on which the first conductive film 130, the metal oxide film 140 and the second conductive film 150 disposed, and light is selectively irradiated by using a mask 180 including a transmission region (I) and a blocking region (II) to the photosensitive film 170.

In this case, the mask 180 includes the transmission region (I) that allows irradiated light to be entirely transmitted therethrough and the blocking region (II) that entirely blocks the irradiated light. Only light which has transmitted through the mask 180 can be irradiated on the photosensitive film 170.

Figure 5C:
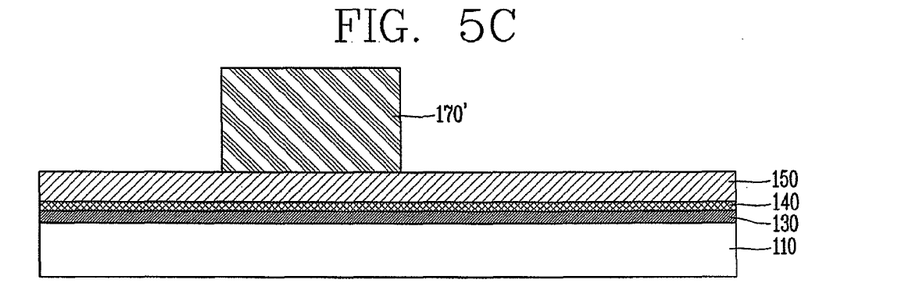

Subsequently, when the first photosensitive film 170 which has been exposed through the half-tone mask 180 is developed, as shown in FIG. 5C, first to fourth photosensitive film patterns 170a to 170d remain at regions where light has been entirely blocked or partially blocked through the blocking region (III) and the second transmission region (II), while the first photosensitive film at the transmission region (I) through which light had been entirely transmitted has been completely removed to expose the surface of the second conductive film 130.

Figure 5D:
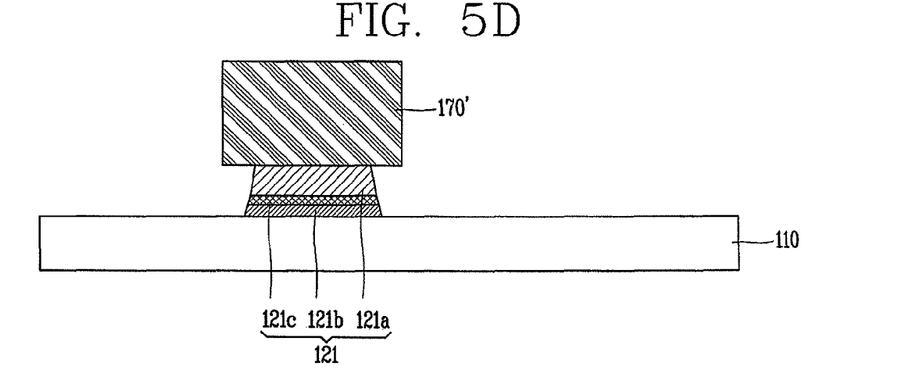

At this time, the first to third photosensitive film patterns 170a to 170c formed at the blocking region (III) are thicker than the fourth photosensitive film pattern 170d formed through the second transmission region (II). In addition, the first photosensitive film at the region where the light had entirely transmitted through the first transmission region (I) has been completely removed. While here a positive photoresist has been used, the present invention is limited thereto, and a negative photoresist can be also used And then, as shown in FIG. 5D, the first conductive film, the metal oxide film and the second conductive film are selectively removed through a wet etching process by using the photosensitive film pattern 170' as a mask. As a result, the gate electrode 121 and the gate line (not shown), formed as a triple layer of the barrier metal, the metal oxide film and the copper, are formed.

In this case, the gate electrode 121 includes the first gate electrode 121a formed of copper, which is the second conductive film; the second gate electrode 121b made of the barrier metal, which is the first conductive film; and the metal oxide film pattern 121c formed of the oxide film of the barrier metal.

Here, the first conductive film, the metal oxide film and the second conductive film may be etched through a collective etching process using hydrogen peroxide ($H_2O_2$)-based etchant, and in this case, the metal oxide film serves to restrain electromigration due to a potential difference between the copper and the barrier metal where the low-resistance copper wiring structure of the copper and the barrier metal is exposed to the corrosion environment by the etchant. Consequently, the galvanic corrosion can be restrained, and thus, the reliability of the elements can be improved.

For reference, the galvanic corrosion refers to corrosion caused as different metals are in contact with each other and one of them accelerates oxidation of the other. Namely, when two different metals come near each other, a voltage is generated due to a potential difference between the two metals, and current flows across them. When the two different metals are in contact with each other electrically, one metal with a relatively large activity (low potential) acts as an anode while the other metal with a relatively small activity (high potential) acts as a cathode due to the difference of work functions on the interface. When the two metals are exposed to a corrosive solution, the metal of the anode is corroded due to the potential difference between the metals, which is called the galvanic corrosion. The anode with the larger activity is corroded at a higher speed compared with when it solely exists, and the cathode with the smaller activity is corroded at a lower speed.

Figure 4B:
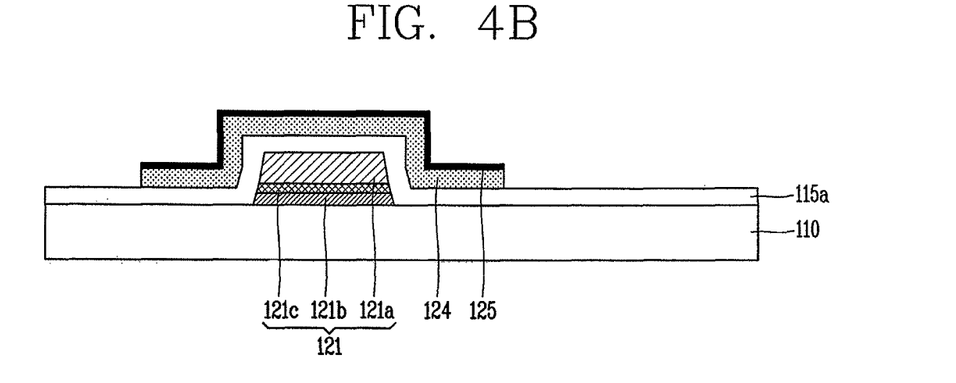

Next, as shown in FIG. 4B, a first gate insulating layer 115a, an amorphous silicon thin film and an n+ amorphous silicon thin film are deposited on the entire surface of the array substrate 110 with the gate electrode 121 and the gate line formed thereon, and then, the amorphous silicon thin film and the n+ amorphous silicon thin film are selectively removed through a photolithography process (a second masking process) to form an active pattern 124 formed of the amorphous silicon thin film on the array substrate 110.

Figure 4C:
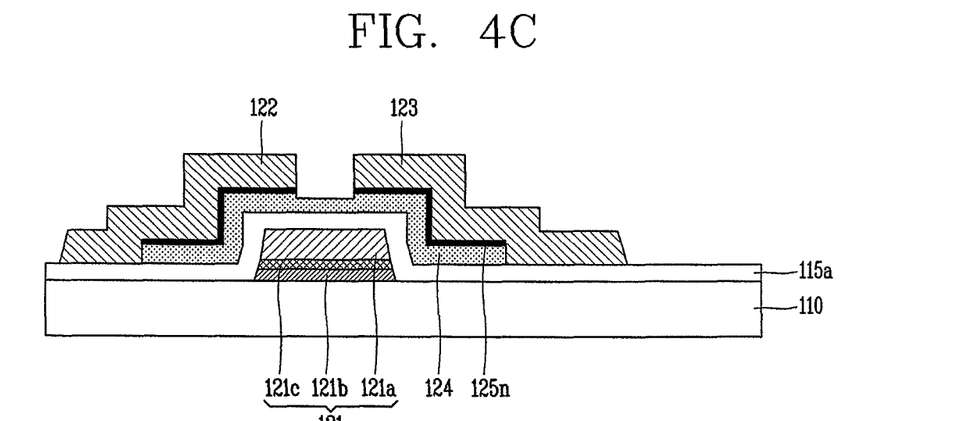

At this time, an n+ amorphous silicon thin film pattern 125, which is formed of the n+ amorphous silicon thin film and has been patterned in the same form as the active pattern 124, remains on the active pattern 124.

subsequently, as shown in FIG. 4C, a third conductive film is formed on the entire surface of the array substrate 110 with the active pattern 124 formed thereon and selectively patterned by using a photolithography process (a third masking process) to form the source electrode 122, the drain electrode 123 and the data line (not shown) formed of the third conductive film on the active pattern 124. At this time, a certain portion of the n+ amorphous silicon thin film pattern formed on the active pattern 124 is removed through the third masking process to form an ohmic-contact layer 125n allowing the active pattern 124 and the source/drain electrodes 122 and 123 to make an ohmic-contact with each other.

The source electrode 122, the drain electrode 123 and the data line may be formed as a single layer by using a conductive material such as aluminum (Al), an aluminum alloy, tungsten (W), copper (Cu), chromium (Cr), molybdenum (Mo), or the like, or may be formed as a multi-layer structure including copper, a barrier metal and a barrier metal oxide film like the above-described gate wiring.

In the first embodiment of the present invention, the case where the active pattern 124, the source electrode 122 and the drain electrode 123 are formed through the two masking processes is taken as an example, but the present invention is not limited thereto and the active pattern 124, the source electrode 122, and the drain electrode 123 may be formed through a single masking process.

Figure 4D:
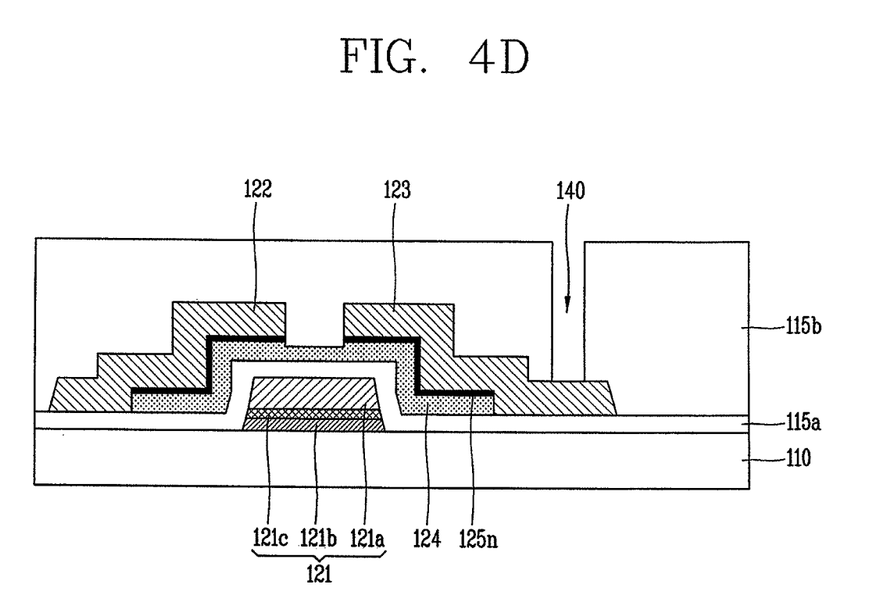

With reference to FIG. 4D, a second insulating layer 115b is deposited on the entire surface of the array substrate 110 with the source electrode 122, the drain electrode 123, and the data line formed thereon, and then, a portion of the second insulating layer 115b is removed through a photolithography process (a fourth masking process) to form the contact hole 140 exposing a portion of the drain electrode 123.

Figure 4E:
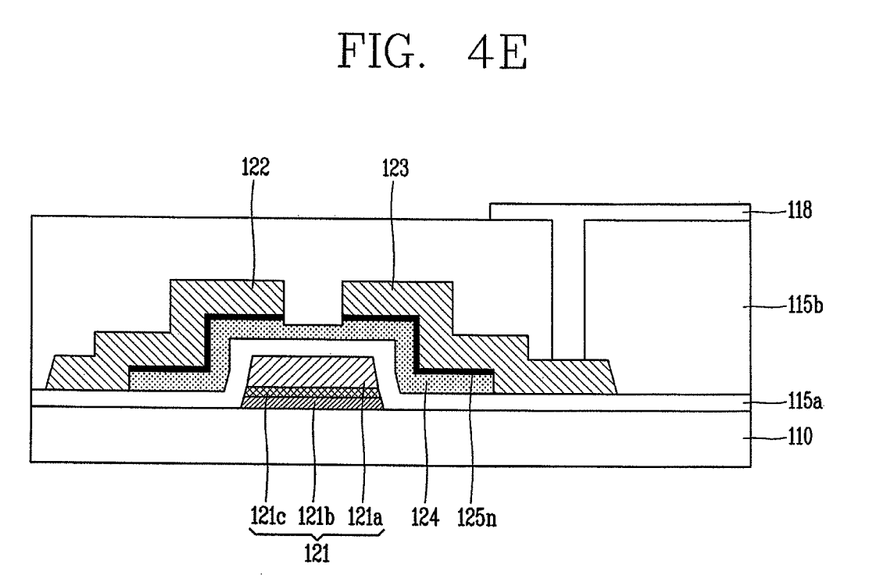

Subsequently, as shown in FIG. 4E, a transparent conductive metal material with good transmittance such as indium tin oxide (ITO), indium zinc oxide (IZO), or the like, is deposited on the entire surface of the array substrate 110 and then selectively patterned through a photolithography process (a fifth masking process) to form the pixel electrode 118 electrically connected with the drain electrode 123 via the contact hole 140.

Here, in the first embodiment of the present invention, the array substrate of the LCD is fabricated through a total of five masking processes, but the present invention is not limited to the number of masking processes and can be applicable to any process so long as, in the process, the gate wiring and the data wiring are formed of the low resistance copper wirings including copper, the barrier metal and the barrier metal oxide film.

Also, the TFT according to the first embodiment of the present invention is the bottom gate type TFT in which the gate electrode is positioned at the lower portion, but the present invention is not limited thereto and is applicable to any structure such as an etch stopper structure or a coplanar structure as well as to an top gate type TFT in which the gate electrode is positioned at an upper portion.

The above-described LCD is a twisted nematic (TN) mode LCD in which nematic-phase liquid crystal molecules are driven in a direction perpendicular to the substrates. The TN mode LCD, however, is disadvantageous in that the viewing angle is a narrow 90°. This results from a refractive anisotropy of the liquid crystal molecules where molecules aligned to be horizontal to the substrates are changed in alignment to be aligned in a direction substantially perpendicular to the substrates when voltage is applied to the liquid crystal panel.

In an IPS mode LCD, liquid crystal molecules are driven in the direction horizontal to the substrates thereby improving a viewing angle by more than 170°. The low resistance copper wiring structure constructed as described according to the present invention can be applicable to the IPS mode LCD. The IPS mode LCD will now be described in detail with reference to the accompanying drawings.

Figure 6:
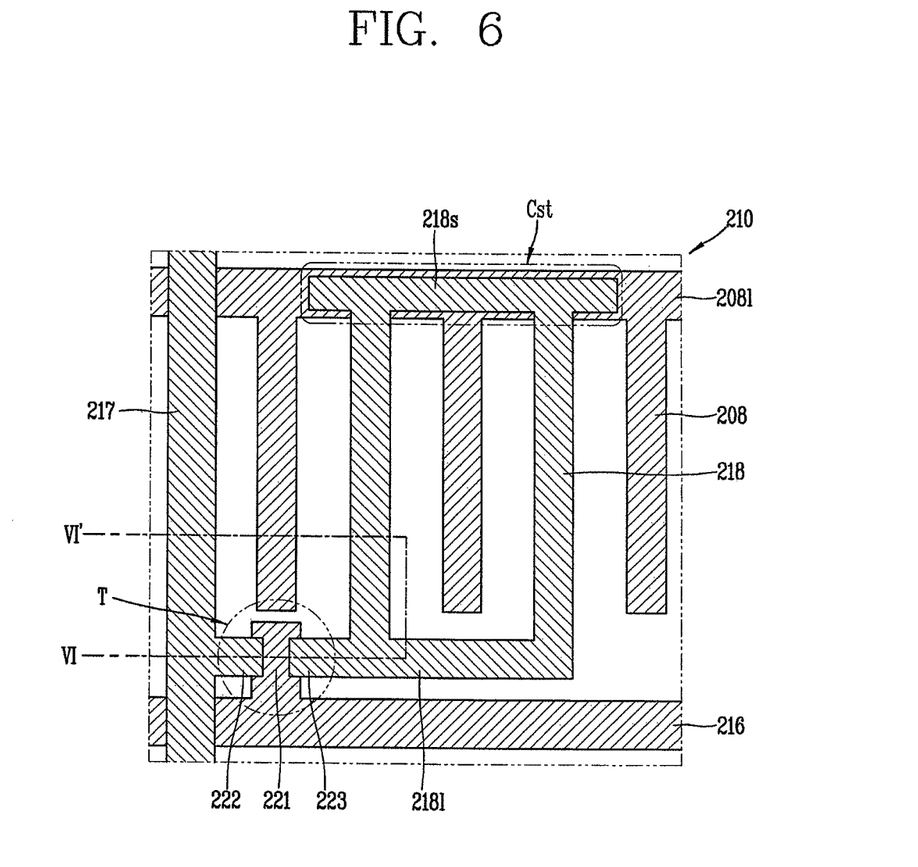
FIG. 6 is a plan view schematically showing a portion of the array substrate of the LCD according to a second embodiment of the present invention.

FIG. 6 is a plan view schematically showing a portion of the array substrate of the LCD according to a second embodiment of the present invention. While in practice, N number of gate lines and M number of data lines are formed to cross each other to define M×N number of pixels in an actual LCD, to simplify the explanation, only a single pixel is shown on the drawing.

As illustrated, gate lines 216 and the data lines 217 are formed to be arranged vertically and horizontally to define the pixel area on a transparent array substrate 210. A thin film transistor (TFT) (T) which is a switching element, is disposed at a crossing of the gate line 216 and the data line 217.

The TFT (T) includes a gate electrode 221 connected with the gate line 216, a source electrode 222 connected with the data line 217 and a drain electrode 223 connected with a pixel electrode 218 via a pixel electrode line 218l. Also, the TFT (T) includes a first insulating layer (not shown) for insulating the gate electrode 221 and the source/drain electrodes 222 and 223, and an active pattern (not shown) for forming a conductive channel between the source and drain electrodes 222 and 223 by a gate voltage applied to the gate electrode 221.

A common line 208l and a storage electrode 218s are arranged in a direction parallel to the gate line 216, and a plurality of common electrodes 208 and pixel electrodes 218 are arranged to be parallel to the data line 217 and switch liquid crystal molecules (not shown) by generating an in-plane (horizontal) field in a pixel area.

The plurality of common electrodes 208 are formed simultaneously when the gate line 216 is formed, and are connected with the common line 208l, and the plurality of pixel electrodes 218 are formed simultaneously when the data line 217 is formed, and connected with the pixel electrode line 218l and the storage electrode 218s.

The pixel electrodes 218 connected with the pixel electrode line 218l are electrically connected with the drain electrode 223 of the TFT (T) via the pixel electrode line 218l.

The storage electrode 218s overlaps with a portion of the lower common line 208l with the first insulating layer interposed therebetween to form a storage capacitor Cst.

The IPS mode LCD having such a structure as described above is advantageous in that its viewing angle can be improved because the common electrodes and the pixel electrodes are disposed on the same array substrate and generate the in-plane field.

The IPS mode LCD according to the second embodiment of the present invention has the dual-metal structure including the common electrodes and the pixel electrodes both made of a opaque conductive material, but the present invention is not limited thereto and may be applicable to an IPS mode LCD having a 1-Metal 1-ITO structure in which one of the common-electrodes and the pixel electrodes is made of an opaque conductive material while the other is made of a transparent conductive material, and an IPS mode LCD having a 2-ITO structure in which both the common electrodes and the pixel electrodes are made of a transparent conductive material.

A method for fabricating the IPS mode LCD according to the second embodiment of the present invention will now be described in detail with reference to the accompanying drawings.

FIGS. 7A to 7D are sectional views sequentially showing a fabrication process taken along line VI-VI' of the array substrate in FIG. 6, in which the same copper wiring structure as in the first embodiment of the present invention is applied to the gate wiring of the array substrate.

Figure 7A:
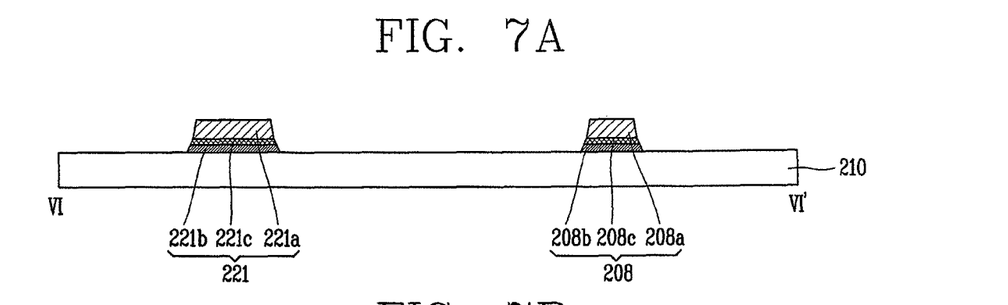
FIGS. 7A to 7D are sectional views sequentially showing a fabrication process taken along line VI-VI' of the array substrate in FIG. 6.

As shown in FIG. 7A, the gate electrode 221, the gate line (not shown) and the common electrode 208, each of which are comprised of a triple layer including a barrier metal, a metal oxide film and copper, are formed on the array substrate 210 made of a transparent insulation material such as glass.

In this case, in the second embodiment of the present invention, the gate electrode 221, the gate line and the common electrode 208 are formed by sequentially depositing a first conductive film, a metal oxide layer and a second conductive film on the entire surface of the array substrate 210 and selectively patterning them through a photolithography process (a first masking process).

Here, the first conductive film may contain a metal such as molybdenum (Mo), tungsten (W), manganese (Mn), technetium (Tc), rhenium (Re), ferrum (Fe), ruthenium (Ru), osmium (Os), or the like, or their nitride. The second conductive film may include copper (Cu) having good resistivity and electron transfer characteristics. The first conductive film prevents copper, which is the second conductive film, from spreading to an insulating layer or a semiconductor layer, and serves as a barrier metal for improving bonding (adhesion) characteristics with the glass substrate.

The metal oxide film is positioned between the first and second conductive films and restrains electromigration due to a potential difference between copper and the barrier metal to thereby prevent galvanic corrosion.

The metal oxide film may be made of metal oxide constituting the first conductive film, and if the first conductive film is made of, for example, molybdenum, the metal oxide film may be made of molybdenum oxide (MoOx).

In particular, the metal oxide film restrains a galvanic corrosion generated due to a potential difference with copper when a pure metal material instead of a metal alloy is used as a barrier metal layer, and may be formed by using a sputtering method for forming the first and the second conductive films.

Here, the first conductive film and the metal oxide film may be formed with a thickness of about 10 Å~500 Å, and in case of the second conductive film, it may have a different thickness according to types of wirings to be formed, and for example, if the gate electrode 221 is formed, the second conductive film may be formed with a thickness of about 1000 Å~5000 Å.

The metal oxide film may be deposited through sputtering at a flow ratio of 0%~50% of $Ar/O_2$ of and at a pressure of below 50 Pa.

When the first conductive film, the metal oxide film and the second conductive film are selectively removed by through a wet etching process, the gate electrode 221, the gate line and the common electrode 208, formed as a triple layer of the barrier metal, the metal oxide film and the copper, are formed on the array substrate 210.

In this case, the gate electrode 221 includes a first gate electrode 221a formed of copper which is the second conductive film, a second gate electrode 221b made of the barrier metal which is the first conductive film, and a metal oxide film pattern 221c formed of the oxide film of the barrier metal.

In addition, the common electrode 208 includes a first common electrode 208a formed of the copper which is the second conductive film, a second common electrode 208b made of the barrier metal which is the first conductive film, and a second metal oxide film pattern 208c formed of the oxide film of the barrier metal.

Here, the first conductive film, the metal oxide film and the second conductive film may be etched through a collective etching process using hydrogen peroxide ($H_2O_2$)-based etchant, and in this case, the metal oxide film serves to restrain electromigration due to a potential difference between the copper and the barrier metal where the low-resistance copper wiring structure of the copper and the barrier metal is exposed to the corrosion environment by the etchant. Consequently, the galvanic corrosion can be restrained, and thus, the reliability of the elements can be improved.

Figure 7B:
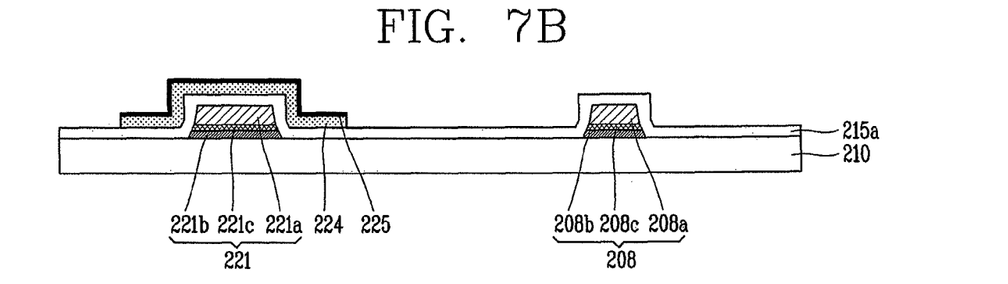

And then, as shown in FIG. 7B, a first gate insulating layer 215a, an amorphous silicon thin film and an n+ amorphous silicon thin film are deposited on the entire surface of the array substrate 210 with the gate electrode 221, the gate line and the common electrode 208 formed thereon, and then, the amorphous silicon thin film and the n+ amorphous silicon thin film are selectively removed through a photolithography process (a second masking process) to form an active pattern 224 formed of the amorphous silicon thin film on the array substrate 210.

At this time, an n+ amorphous silicon thin film pattern 225, which is formed of the n+ amorphous silicon thin film and has been patterned in the same form as the active pattern 224, remains on the active pattern 224.

Figure 7C:
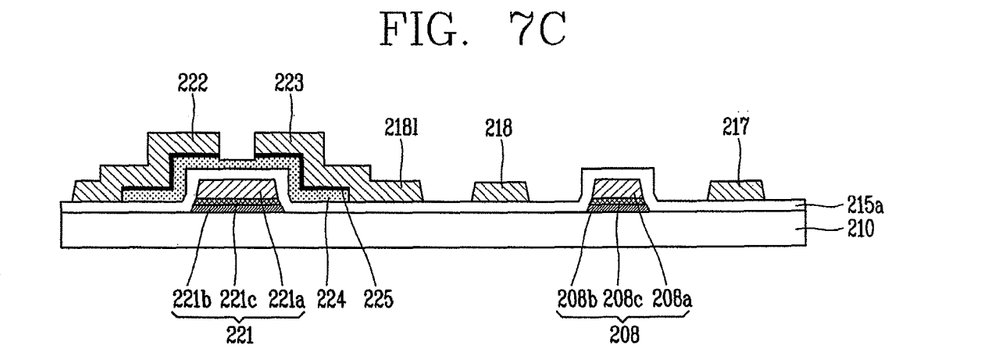

Next, as shown in FIG. 7C, a third conductive film is formed on the entire surface of the array substrate 210 with the active pattern 224 formed thereon and selectively patterned by using a photolithography process (a third masking process) to form the source electrode 222, the drain electrode 223 and the data line 217 formed of the third conductive film on the active pattern 224. In addition, the third conductive film is selectively patterned through the third masking process to form the pixel electrode 218 and the pixel electrode line 218l formed of the third conductive film at the pixel area.

At this time, a certain portion of the n+ amorphous silicon thin film pattern formed on the active pattern 224 is removed through the third masking process to form an ohmic-contact layer 225n allowing the active pattern 224 and the source/drain electrodes 222 and 223 to make an ohmic-contact with each other. In addition, a portion of the drain electrode 223 extends toward the pixel area to form the pixel electrode line 218l.

The source electrode 222, the drain electrode 223, the data line, the pixel electrode 218 and the pixel electrode line 218l may be formed as a single layer by using a conductive material such as aluminum (Al), an aluminum alloy, tungsten (W), copper (Cu), chromium (Cr), molybdenum (Mo), or the like, or may be formed as a multi-layer structure including copper, a barrier metal and a barrier metal oxide film like the above-described gate wiring.

In the second embodiment of the present invention, the case where the active pattern 224, the source electrode 222 and the drain electrode 223 are formed through two masking process is taken as an example, but the present invention is not limited thereto and the active pattern 224, the source electrode 222, and the drain electrode 223 may be formed through a single masking process.

Figure 7D:
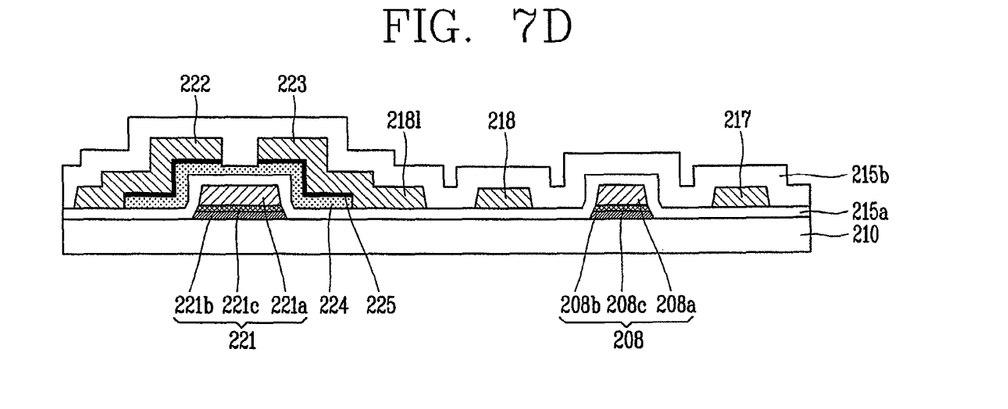

With reference to FIG. 7D, a second insulating layer 215b is deposited on the entire surface of the array substrate 210 with the source electrode 222, the drain electrode 223, the data line 217, the pixel electrode 218 and the pixel electrode line 218l formed thereon.

Here, in the first embodiment of the present invention, the array substrate of the LCD is fabricated through a total of four masking processes, but the present invention is not limited to the number of masking processes and can be applicable to any process so long as, in the process, the gate wiring and the data wiring are formed of the low resistance copper wirings including copper, the barrier metal and the barrier metal oxide film.

Also, the TFT according to the first embodiment of the present invention is the bottom gate type TFT in which the gate electrode is positioned at the lower portion, but the present invention is not limited thereto and is applicable to any structure such as an etch stopper structure or a coplanar structure as well as to an top gate type TFT in which the gate electrode is positioned at an upper portion.

The IPS mode LCD according to the second embodiment of the present invention includes, for example, the dual-metal structure including the common electrode and the pixel electrode made of the opaque conductive material, but the present invention is not limited thereto and can be applicable to an IPS mode LCD having a 1-Metal 1-ITO structure or a 2-ITO structure.

In the first and second embodiments of the present invention, as the active patterns, the amorphous silicon TFT using the amorphous silicon thin film is used as an example, but the present invention is not limited thereto and as the active patterns, polycrystalline silicon TFTs using a polycrystalline silicon thin film can be also used.

The array substrates according to the first and second embodiments of the present invention are attached with color filter substrates in a facing manner by means of a sealant applied to outer edges of the image display part. In this case, the color filter substrates include black matrixes for preventing leakage of light to the TFTs, the gate lines and the data lines, and color filters for implementing red, green and blue colors.

The attachment of the color filter substrates and the array substrates is made through attachment keys formed on the color filter substrates or the array substrates.

The present invention can be also applied to a different display device fabricated using TFTs, for example, an OLED (Organic Light Emitting Diode) display device in which OLEDs are connected with driving transistors.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

The invention claimed is:

1. A liquid crystal display device comprising:
a first substrate;
a gate electrode and a gate line, each comprised of a triple layer, wherein the triple layer includes a second wiring formed on the first substrate, a metal oxide film formed on the second wiring and a first wiring formed on the metal oxide film, the metal oxide film being disposed between and in direct contact with the first and second wirings,
wherein the first wiring is made of copper and the second wiring is made of a barrier metal,
wherein the barrier metal is made of a pure metal material of molybdenum (Mo), tungsten (W), manganese (Mn), technetium (Tc), rhenium (Re), ferrum (Fe), ruthenium (Ru) or osmium (Os),
wherein the metal oxide film is made of oxide of materials used for the barrier metal,
wherein the first wiring and the metal oxide film are patterned in the same shape as the second wiring to prevent spreading of copper to the first substrate;
a first insulating layer on the first substrate with the gate electrode and the gate line formed thereon;
an active pattern on the first insulating layer;
a source electrode, a drain electrode and a data line on the first substrate with the active pattern formed thereon;
a second insulating layer on the first substrate with the source electrode, the drain electrode and the data line formed thereon; and
a second substrate coupled to the first substrate in a facing manner.

2. The device of claim 1, wherein the source electrode, the drain electrode and the data line are each comprised of a triple layer including a first wiring made of copper, a second wiring made of a barrier metal and a metal oxide film made of oxide of the barrier metal.

3. The device of claim 2, wherein the first wiring and the metal oxide film of each of the source electrode, the drain electrode and the data line are patterned in the same shape as the second wiring of each of the source electrode, the drain electrode and the data line to prevent spreading of copper to the active pattern.

4. The device of claim 1, wherein when exposed to a corrosive environment, the metal oxide film prevents electromigration due to a potential difference between the copper and the barrier metal.

5. The device of claim 1, wherein the second wiring and the metal oxide film have a thickness of about 10 Å to 500 Å.

6. The device of claim 1, wherein the first wiring has a thickness of about 1000 Å to 5000 Å.

7. A liquid crystal display device comprising:
a first substrate;
a gate electrode and a gate line, each comprised of a triple layer including a first wiring made of copper, a second wiring made of a barrier metal and a metal oxide film made of oxide of the barrier metal, formed on the first substrate,
wherein the barrier metal comprises at least one pure metal material selected from a group consisting of molybdenum (Mo), tungsten (W), manganese (Mn), technetium (Tc), rhenium (Re), ferrum (Fe), ruthenium (Ru) and osmium (Os),
wherein the second wiring is disposed under the first wiring, and the metal oxide film is disposed between the first wiring and the second wiring, the metal oxide film made of oxide of the barrier metal restraining electromigration of copper due to a potential difference between copper and the barrier metal,
wherein the metal oxide film restrains a galvanic corrosion generated due to a potential difference with copper when the pure metal material instead of a metal alloy is used as the barrier metal layer,
wherein the first wiring and the metal oxide film are patterned in the same shape as the second wiring to prevent spreading of copper to the first substrate;
a first insulating layer on the first substrate with the gate electrode and the gate line formed thereon;
an active pattern on the first insulating layer;
a source electrode, a drain electrode and a data line on the first substrate with the active pattern formed thereon, and wherein the source electrode, the drain electrode and the data line are each comprised of the triple layer including the first wiring made of copper, the second wiring made of the barrier metal and the metal oxide film made of the oxide of the barrier metal;
a second insulating layer on the first substrate with the source electrode, the drain electrode and the data line formed thereon; and
a second substrate coupled to the first substrate in a facing manner.

8. A liquid crystal display device comprising:
a first substrate on which are formed a thin film transistor (TFT), a data line and a gate line, wherein the TFT comprises a gate electrode, a source electrode, and a drain electrode, and further, wherein each of the source electrode, the drain electrode of the TFT and the data line comprises three layers including a first wiring made of copper, a second wiring made of a barrier metal and a metal oxide film made of oxide of the barrier metal between the first wiring and the second wiring;

a first insulating layer deposited on the first substrate with the gate electrode and the gate line formed thereon, the first insulating layer deposited in a particular pattern;

a second insulating layer deposited on the first substrate with the source electrode, the drain electrode, and the data line formed thereon, the second insulating layer deposited in the particular pattern; and a second substrate coupled to the first substrate in a facing manner.

9. The liquid crystal display device of claim 8, wherein the barrier metal comprises a pure metal material selected from a group consisting of molybdenum (Mo), tungsten (W), manganese (Mn), technetium (Tc), rhenium (Re), ferrum (Fe), ruthenium (Ru) and osmium (Os).

* * * * *